United States Patent
Sheu et al.

(10) Patent No.: US 11,519,962 B2
(45) Date of Patent: Dec. 6, 2022

(54) TEST CIRCUIT

(71) Applicant: Realtek Semiconductor Corporation, Hsinchu (TW)

(72) Inventors: Jeong-Fa Sheu, Hsinchu (TW); Chen-Kuo Hwang, Hsinchu (TW); Mei-Chuan Lu, Hsinchu (TW); Wei-Chung Cho, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/409,871

(22) Filed: Aug. 24, 2021

(65) Prior Publication Data

US 2022/0283222 A1 Sep. 8, 2022

(30) Foreign Application Priority Data

Mar. 3, 2021 (TW) .................................. 110107576

(51) Int. Cl.
*G01R 31/3177* (2006.01)
*G01R 31/3185* (2006.01)
*G01R 31/3183* (2006.01)
*G01R 31/3187* (2006.01)

(52) U.S. Cl.
CPC ..... *G01R 31/3177* (2013.01); *G01R 31/3183* (2013.01); *G01R 31/3187* (2013.01); *G01R 31/318307* (2013.01); *G01R 31/318502* (2013.01); *G01R 31/318533* (2013.01); *G01R 31/318536* (2013.01); *G01R 31/318541* (2013.01); *G01R 31/318566* (2013.01)

(58) Field of Classification Search
CPC ............ G01R 31/3177; G01R 31/3183; G01R 31/318307; G01R 31/318502; G01R 31/318533; G01R 31/318536; G01R 31/318541; G01R 31/318566; G01R 31/3187
USPC ......... 714/726, 729, 724, 718; 365/200, 201
See application file for complete search history.

(56) References Cited

U.S. PATENT DOCUMENTS

| 5,838,693 | A | * | 11/1998 | Morley | ............ G01R 31/31704 714/733 |
| 5,909,451 | A | * | 6/1999 | Lach | ......................... G06F 5/06 714/726 |
| 6,615,392 | B1 | * | 9/2003 | Nadeau-Dostie | ............................ G01R 31/318591 716/105 |
| 7,698,613 | B2 | * | 4/2010 | Kudo | ............ G01R 31/318552 714/744 |

(Continued)

*Primary Examiner* — John J Tabone, Jr.
(74) *Attorney, Agent, or Firm* — Locke Lord LLP; Tim Tingkang Xia, Esq.

(57) ABSTRACT

A test circuit for testing an integrated circuit includes a plurality of normal flip flops and a modified flip flop, wherein the integrated circuit includes a black box circuit and a plurality of combinational logic circuits. The normal flip flops each includes a first input pin, a second input pin and a first output pin and is configured to temporarily store the input value of the first input pin or the input value of the second input pin according to a scan enable signal. The modified flip flop includes a third input pin, a fourth input pin and a second output pin which are coupled to the black box circuit, the normal flip flops and the combinational logic circuits and is configured to temporarily store the input value of the third input pin or the input value of the fourth input pin according to a scan test mode signal.

17 Claims, 5 Drawing Sheets

(56) References Cited

U.S. PATENT DOCUMENTS

| | | | |
|---|---|---|---|
| 9,297,855 B1* | 3/2016 | Jindal | G06F 30/30 |
| 2004/0111658 A1* | 6/2004 | Natsume | G01R 31/318583 |
| | | | 714/752 |
| 2004/0117706 A1* | 6/2004 | Maeno | G01R 31/318555 |
| | | | 714/726 |
| 2007/0226565 A1* | 9/2007 | Kudo | G01R 31/318552 |
| | | | 714/731 |
| 2011/0072323 A1* | 3/2011 | Chong | G11C 29/32 |
| | | | 714/719 |
| 2013/0111285 A1* | 5/2013 | Chakravarty | G01R 31/318541 |
| | | | 714/E11.155 |
| 2013/0117618 A1* | 5/2013 | Kukreja | G01R 31/318552 |
| | | | 714/E11.148 |
| 2014/0019818 A1* | 1/2014 | Jindal | G06F 11/2215 |
| | | | 714/724 |
| 2015/0234010 A1* | 8/2015 | Kim | G01R 31/3187 |
| | | | 714/735 |
| 2016/0169966 A1* | 6/2016 | Abshishek | G01R 31/318541 |
| | | | 714/727 |
| 2021/0173006 A1* | 6/2021 | Roy | H03K 19/173 |

* cited by examiner tion.

TEST CIRCUIT

CROSS-REFERENCE TO RELATED APPLICATION

This application claims priority to Taiwan Application Serial Number 110107576, filed Mar. 3, 2021, which is herein incorporated by reference in its entirety.

BACKGROUND

Field of Invention

This disclosure relates to a test circuit for the integrated circuit, and in particular to a test circuit for testing the integrated circuit including the memory.

Description of Related Art

Following the development of the semiconductor process technology, the integrated circuit (IC) includes the digital logic circuit and multiple embedded memories (e.g., TCAM/CAM, RAM, SRAM). Generally, the integrated circuit further includes the memory build-in self-test (MBIST) circuit for testing the embedded memories and the scan chain test circuit for testing the digital logic circuit.

However, the conventional scan chain test circuit includes the by-pass circuit for bypassing the memory and the multiplexer for outputting either the output signal of the memory or the output signal of the by-pass circuit. The by-pass circuit usually causes the integrated circuit to increase in the circuit area and to have the problem of routing congestion. The multiplexer may make easy for the output signal of the memory to delay, so as to cause the problem of timing violation.

SUMMARY

An aspect of present disclosure relates to a test circuit for testing an integrated circuit, wherein the integrated circuit includes a black box circuit and a plurality of combinational logic circuits. The test circuit includes a plurality of normal flip flops and a modified flip flop. The normal flip flops each includes a first input pin, a second input pin and a first output pin and is configured to temporarily store the input value of the first input pin or the input value of the second input pin according to a scan enable signal. The modified flip flop is coupled to the black box circuit, the normal flip flops and the combinational logic circuits. The modified flip flop includes a third input pin, a fourth input pin and a second output pin and is configured to temporarily store either the value of the third input pin or the value of the fourth input pin according to a scan test mode signal.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

In addition, the terms "combinational logic circuit" as used herein means the circuit composed of a variety of logic gates. The terms "normal flip flop" and "modified flip flop" as used herein means "sequential logic circuit" which is different to the combinational logic circuit.

Figure 1:
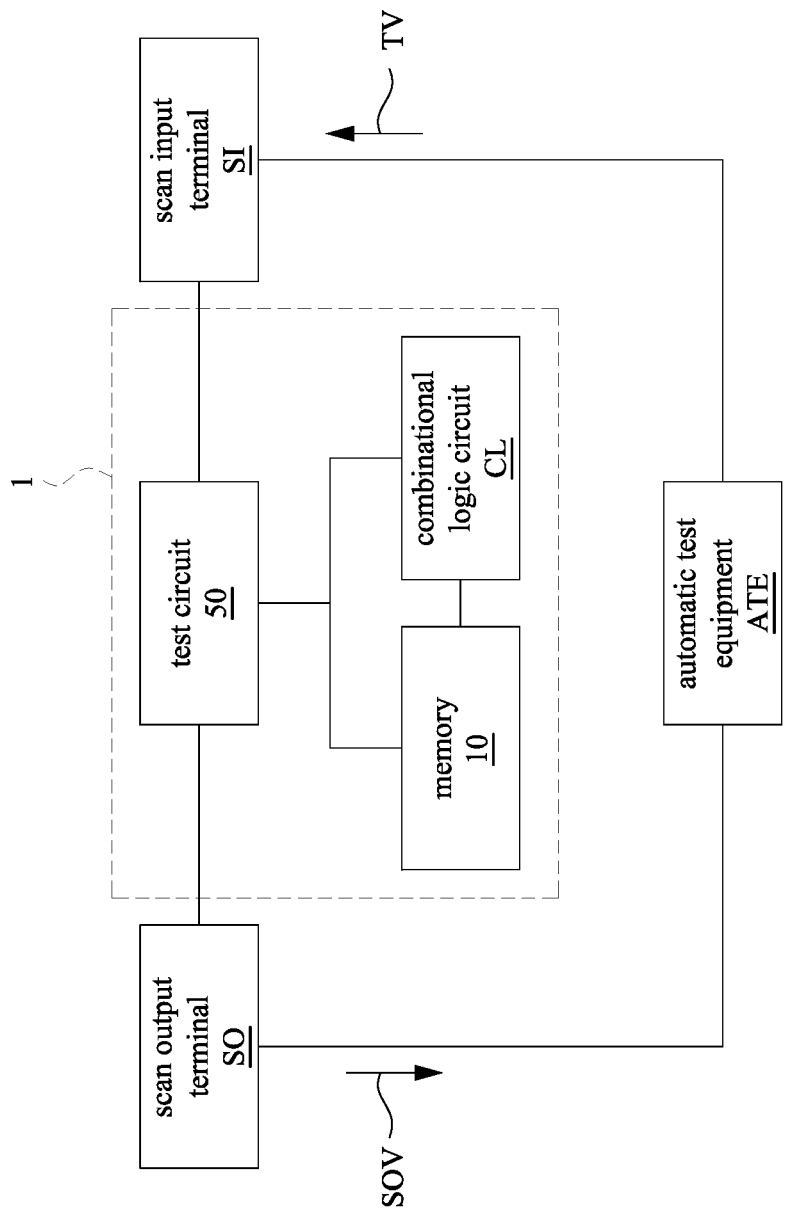
FIG. 1 is a schematic diagram of the integrated circuit being tested by the automatic test equipment in accordance with some embodiments of the present disclosure.

Referring to FIG. 1, FIG. 1 illustrates that the integrated circuit 1 on the chip (not shown) can be tested by the automatic test equipment ATE external to the chip. As shown in FIG. 1, the integrated circuit 1 includes a memory 10, a plurality of combinational logic circuits (FIG. 1 shows one combinational logic circuit CL only for simplifying description) and a test circuit 50 in accordance with some embodiments of the present disclosure. The memory 10, the combinational logic circuit CL and the test circuit 50 are coupled to each other. When testing the integrated circuit 1, the automatic test equipment ATE generates the known test vector TV, inputs the test vector TV to the integrated circuit 1 through the scan input terminal SI on the chip and receives the scan output value SOV of the test circuit 50 through the scan output terminal SO on the chip, so as to determine whether the combinational logic circuit CL is normal. In addition, the test circuit 50 can further test the memory 10.

Figure 2:
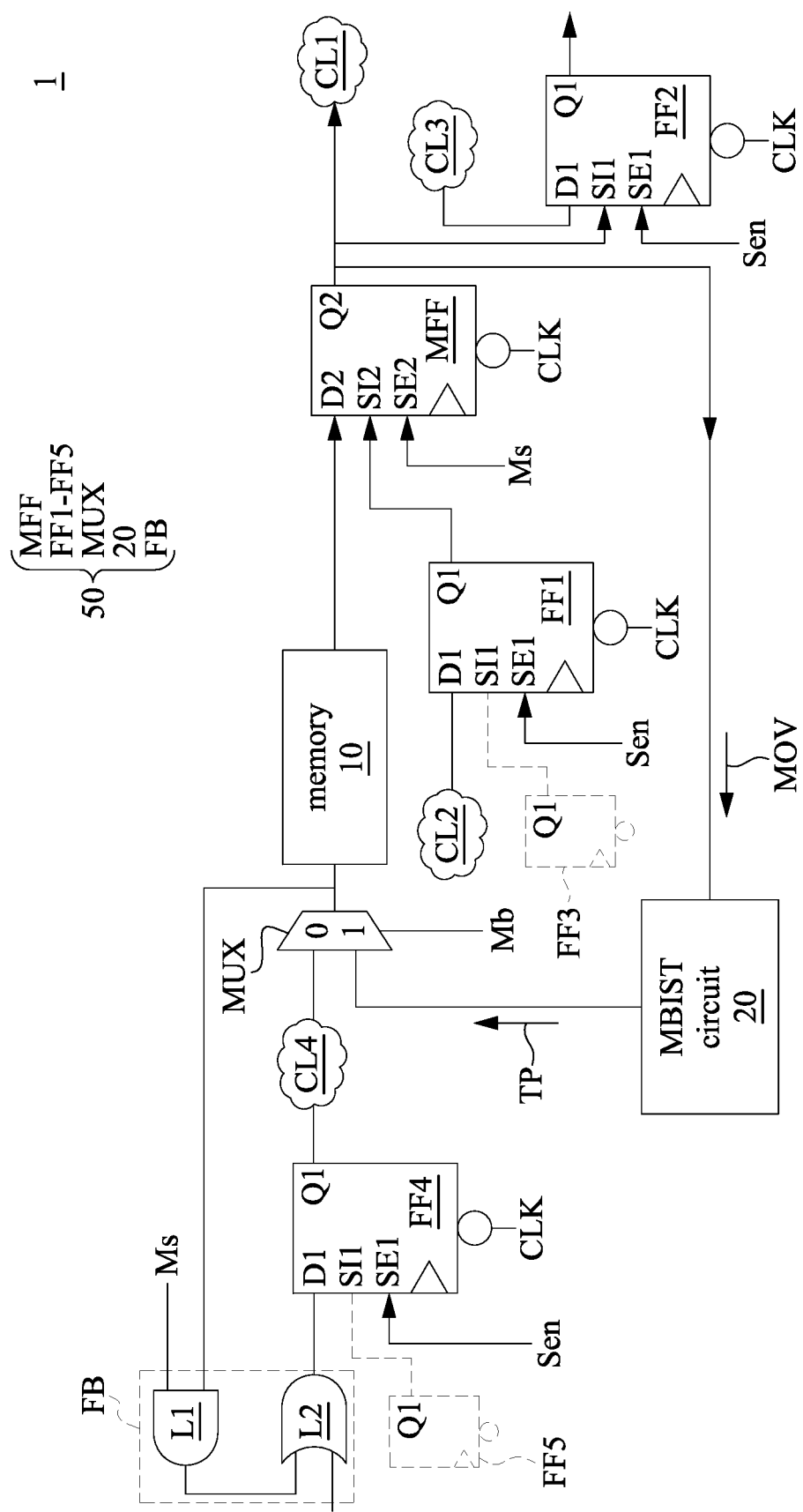
FIG. 2 is a schematic diagram of the integrated circuit including the test circuit in accordance with some embodiments of the present disclosure.

Referring to FIG. 2, in some embodiments, the test circuit 50 includes a plurality of normal flip flops (FIG. 2 shows five normal flip flops FF1-FF5 only for simplifying description), at least one modified flip flop MFF, a memory build-in self-test (MBIST) circuit 20, a multiplexer MUX and a feedback circuit FB. The test circuit 50 can be operated in a scan test mode (for testing the combinational logic circuits on the integrated circuit 1) or a memory build-in self-test mode (for testing the memory 10 on the integrated circuit 1) according to a scan test mode signal Ms and a build-in self-test mode signal Mb.

As shown in FIG. 2, the normal flip flops FF1-FF5 each includes a first input pin D1, a second input pin SI1 a first enable pin SE1 and a first output pin Q1, and is configured to temporarily store (or capture) the input value of the first input pin D1 or the input value of the second input pin SI1 according to a scan enable signal Sen (connected to the first enable pin SE1). The modified flip flop MFF includes a third input pin D2, a fourth input pin SI2, a second enable pin SE2 and a second output pin Q2, and is configured to temporarily store (or capture) the input value of the third input pin D2 or the input value of the fourth input pin SI2 according to the scan test mode signal Ms (connected to the second enable pin SE2). When the test circuit 50 is operated in the scan test mode, the scan test mode signal Ms would be maintained at a first voltage level (e.g., high voltage level). However, the scan enable signal Sen would be set at the first voltage level or a second voltage level (e.g., low voltage level) according to that the test circuit 50 is in a shift phase or a capture phase.

In structure, the first input pin D1 of the normal flip flop FF1 is coupled to the combinational logic circuit CL2. The second input pin SI1 of the normal flip flop FF1 is coupled to the first output pin Q1 of the normal flip flop FF3 (the normal flip flop FF3 in FIG. 2 is labeled with the first output pin Q1 only for simplifying description). The first enable pin SE1 of the normal flip flop FF1 is configured to receive the scan enable signal Sen. The first output pin Q1 of the normal flip flop FF1 is coupled to the fourth input pin SI2 of the modified flip flop MFF.

The first input pin D1 of the normal flip flop FF2 is coupled to the combinational logic circuit CL3. The second input pin SI1 of the normal flip flop FF2 is coupled to the second output pin Q2 of the modified flip flop MFF. The first enable pin SE1 of the normal flip flop FF2 is configured to receive the scan enable signal Sen. The first output pin Q1 of the normal flip flop FF2 is coupled to the other combinational logic circuit (not shown).

In other embodiments, the first output pin Q1 of the normal flip flop FF2 can be coupled to the other combinational logic circuit (not shown) and the post-stage normal flip flop (not shown) simultaneously.

The third input pin D2 of the modified flip flop MFF is coupled to the output terminal of the memory 10. The fourth input pin 512 of the modified flip flop MFF is coupled to the first output pin Q1 of the normal flip flop FF1. The second enable pin SE2 of the modified flip flop MFF is configured to receive the scan test mode signal Ms. The second output pin Q2 of the modified flip flop MFF is coupled to the second input pin SI1 of the normal flip flop FF2, the combinational logic circuit CL1 and the MBIST circuit 20.

Figure 3:
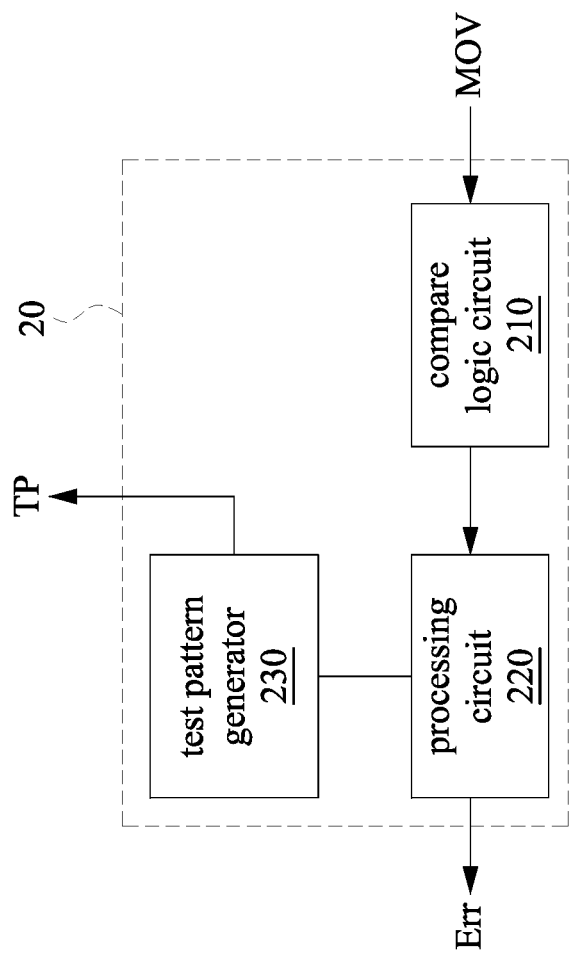
FIG. 3 is a schematic diagram of the memory build-in self-test circuit in accordance with some embodiments of the present disclosure.

In the embodiment as shown in FIG. 2, the memory build-in self-test circuit 20 is coupled to the second output pin Q2 of the modified flip flop MFF and the multiplexer MUX. Referring to FIG. 3, the memory build-in self-test circuit 20 includes a compare logic circuit 210, a processing circuit 220 and a test pattern generator 230. Specifically, the compare logic circuit 210 is coupled to the second output pin Q2 of the modified flip flop MFF, the processing circuit 220 is coupled to the compare logic circuit 210, and the test pattern generator 230 is coupled to the processing circuit 220 and the multiplexer MUX.

As shown in FIG. 2 again, the first input terminal of the multiplexer MUX is coupled to the memory build-in self-test circuit 20, the second input terminal of the multiplexer MUX is coupled to the combinational logic circuit CL4, and the output terminal of the multiplexer MUX is coupled to the input terminal of the memory 10 and the feedback circuit FB.

The first input pin D1 of the normal flip flop FF4 is coupled to feedback circuit FB. The second input pin SI1 of the normal flip flop FF4 is coupled to the first output pin Q1 of the normal flip flop FF5 (the normal flip flop FF5 in FIG. 2 is labeled with the first output pin Q1 only for simplifying description). The first enable pin SE1 of the normal flip flop FF4 is configured to receive the scan enable signal Sen. The first output pin Q1 of the normal flip flop FF4 is coupled to the combinational logic circuit CL4.

In another embodiment, the combinational logic circuit CL4 in FIG. 2 can be omitted. In such way, the first output pin Q1 of the normal flip flop FF4 is directly coupled to an input terminal of the multiplexer MUX (e.g., the above-described second input terminal of the multiplexer MUX), and the circuit operation of the present disclosure is not affected thereby.

Since the memory by-pass circuit has been removed, the combinational logic circuit CL4 and the multiplexer MUX are tested by feeding the output of the multiplexer MUX back to the first input pin of any normal flip flop (e.g., the normal flip flop FF4) through the feedback circuit FB. The feedback circuit FB is coupled to the output terminal of the multiplexer MUX, the first input pin D1 of the normal flip flop FF4 and a logic circuit (not shown). The logic circuit can be the combinational logic circuit or the normal flip flop. Specifically, the feedback circuit FB includes a first logic gate L1 and the second logic gate L2. The first input terminal of the first logic gate L1 is configured to receive the scan test mode signal Ms. The second input terminal of the first logic gate L1 is coupled between the output terminal of the multiplexer MUX and the input terminal of the memory 10. The first input terminal of the second logic gate L2 is coupled to the output terminal of the first logic gate Li. The second input terminal of the second logic gate L2 is coupled to the logic circuit (not shown). The output terminal of the second logic gate L2 is coupled to the first input pin D1 of the normal flip flop FF4.

Regarding to the terms "normal flip flop" as used in the embodiments, its first input pin (e.g., the first input pin D1) is usually coupled to the pre-stage combinational logic circuit, its second input pin (e.g., the second input pin SI1) is usually coupled to the output pin of the pre-stage flip flop, its enable pin (e.g., the first enable pin SE1) is usually configured to receive the scan enable signal Sen, and its output pin (e.g., the first output pin Q1) is usually coupled to the post-stage combinational logic circuit or/and the input pin of the post-stage flip flop, so as to form a scan chain.

Regarding to the terms "modified flip flop" as used in the embodiments, its first input pin (e.g., the third input pin D2) is usually coupled to the output terminal of the memory 10, its second input pin (e.g., the fourth input pin SI2) is usually coupled to the output pin of the pre-stage flip flop, its enable pin (e.g., the second enable pin SF2) is usually configured to receive the scan test mode signal Ms, and its output pin (e.g., the second output pin Q2) is usually coupled to the post-stage combinational logic circuit, the input pin of the post-stage flip flop or/and the memory build-in self-test circuit 20.

In the initial period of the test, the test circuit 50 is operated in the scan test mode to test all combinational logic and flip flop circuits in the integrated circuit 1. When the test circuit 50 is operated in the scan test mode, the scan test mode signal Ms is at the first voltage level (e.g., high voltage level). Since the memory build-in self-test circuit 20 has the combinational logic circuits that can be tested, the voltage level of the build-in self-test signal Mb is not limited.

When the scan test is performed through the scan chain technology, the test process includes the shift phase and the capture phase. In the shift phase, the test vector TV generated by the automatic test equipment ATE is inputted to a first-stage normal flip flop (not shown) in the test circuit 50. In some embodiments, the test vector TV includes a predetermined numbers of "0 (logic zero)" and "1 (logic one)" that are arranged in an order. The automatic test equipment ATE determines the arrangement of "0" and "1" according to the numeral values to which all flip flops in the test circuit 50 would be set.

First, the test circuit 50 is operated in the shift phase of the scan test mode. At this time, the scan test mode signal Ms is at the first voltage level, and the scan enable signal Sen is at the first voltage level. In such way, the normal flip flops FF1-FF5 on the integrated circuit 1 each reads the input value of the second input pin SI1 (i.e., the output value of the pre-stage flip flop) according to the scan enable signal Sen with the first voltage level. The modified flip flop MFF reads the input value of the fourth input pin SI2 (i.e., the output value of the pre-stage flip flop) according to the scan test mode signal Ms with the first voltage level. As shown in FIG. 2 again, the normal flip flops FF1-FF5 and the modified flip flop MFF all receive the clock signal CLK. For example, the normal flip flops FF1-FF5 each has a first clock pin (which is only shown on the normal flip flops FF1-FF2 and FF4 for simplifying description) to receive the clock signal CLK, and the modified flip flop MFF has a second clock pin to receive the clock signal CLK. Following the trigger of pulse of each cycle in the clock signal CLK (i.e., the clock signal CLK includes a plurality of clock pulses), the normal flip flops FF1-FF5 and the modified flip flop MFF each would constantly read (or capture) the output value of the pre-stage flip flop and would propagate the stored value to the post-stage flip flop simultaneously. At the end of the shift phase, the numeral values in the test vector TV, which are prepared for all flip flops in the test circuit 50, are set to all flip flops in the test circuit 50. The action of this phase is to initialize the values of all flip flops.

For example, the numeral values, which are prepared for the modified flip flop MFF and the normal flip flop FF2, in the test vector TV generated by the automatic test equipment ATE are [0, 1]. In one cycle of the clock signal CLK, it is assumed that the values stored by the normal flip flop FF3 and the normal flip flop FF1 are "0" and "1" respectively. In the next cycle, the normal flip flop FF1 would store the value "0" which is temporarily stored by the normal flip flop FF3 previously, and the modified flip flop MFF would store the value "1" which is temporarily stored by the normal flip flop FF1 previously. In addition, the normal flip flop FF2 would store the value (e.g., "0") which is temporarily stored by the modified flip flop MFF previously. In the cycle after next, which is the end of the shift phase, the modified flip flop MFF would store the value "0" which is temporarily stored by the normal flip flop FF1 previously, and the normal flip flop FF2 would store the value "1" which is temporarily stored by the modified flip flop MFF previously.

Then, the test circuit 50 is operated in the capture phase of the scan test mode. In the initial period of the capture phase, the combinational logic circuits each in the integrated circuit 1 would perform calculation according to the numeral values which have been set to the pre-stage flip flop in the shift phase and would generate the output value. When the test circuit 50 is operated in the capture phase of the scan test mode, the scan test mode signal Ms is still at the first voltage level, and the scan enable signal Sen is at the second voltage level (e.g., low voltage level). The difference from the shift phase is that the normal flip flops FF1-FF5 on the integrated circuit 1 each read the input value of the first input pin D1 (i.e., the output value of the pre-stage combinational logic circuit) according to the scan enable signal Sen with the second voltage level. Following the trigger of pulse in the clock signal CLK, the normal flip flops FF1-FF5 each would capture and record the output value of the pre-stage combinational logic circuit, and the modified flip flop MFF would still read the output value of the normal flip flop FF1 according to the scan test mode signal Ms with the first voltage level. At this time, if the modified flip flop MFF reads the output value of the memory 10 through the third input pin D2 as the prior art, the unpredictable memory data would be obtained, so that the test fault coverage rate is decreased. Therefore, the present disclosure modifies the enable pin of the modified flip flop MFF to couple the scan test mode signal Ms so as to increase the test fault coverage rate.

Since the memory by-pass circuit has been removed in this embodiment, the output value of the combinational logic circuit (e.g., the combinational logic circuit CL4 and the multiplexer MUX as shown in FIG. 2 or the combinational logic circuit in the memory build-in self-test circuit 20) coupled to the input terminal of the memory 10 cannot be propagated to the post-stage flip flop (that is, the modified flip flop MFF) through the by-pass circuit. Therefore, the automatic test equipment ATE cannot perform the test on all combinational logic circuits. It is worth noting that the test circuit 50 can feed the output value of the combinational logic circuit coupled to the input terminal of the memory 10 back to the normal flip flop FF4 through the feedback circuit FB. Thus, the automatic test equipment ATE can test the combinational logic circuit coupled to the input terminal of the memory 10 through the normal flip flop FF4.

Specifically, when the test circuit 50 is operated in the capture phase, the multiplexer MUX outputs the output value of the combinational logic circuit in the memory build-in self-test circuit 20 or the output value of the combinational logic circuit CL4 according to the build-in self-test signal Mb with the first voltage level or the second voltage level. In some embodiments, the first logic gate L1 is AND gate, and the second logic gate L2 is OR gate. The first logic gate L1 outputs the output value of the multiplexer MUX according to the scan test mode signal Ms with the first voltage level. The second logic gate L2 performs the calculation according to the output value of the first logic gate L1 and the output value of the logic circuit (not shown), so as to output a feedback value to the first input pin D1 of the normal flip flop FF4.

After the capture phase is finished, the test circuit 50 is operated in the shift phase again. In such way, the output value of each combinational logic circuit in the integrated circuit 1 can be transferred to each flip flop in the test circuit 50 sequentially, be outputted through the scan output terminal SO finally and be received by the automatic test equipment ATE, so as to determine whether each combinational logic circuit in the integrated circuit 1 can be normally operated. In addition, the feedback value can be propagated from the normal flip flop FF4 to the several post-stage flip flops, so that the automatic test equipment ATE can determine whether the combinational logic circuit coupled to the input terminal of the memory 10 is normally operated by receiving the feedback value.

In some embodiments, as the output value of each combinational logic circuit in the integrated circuit 1 is outputted, another group of the numeral values in another test vector TV generated by the automatic test equipment ATE can also be stored to each flip flop in the integrated circuit 1 sequentially through the scan input terminal SI simultaneously, so as to perform another test. In other words, before the test for all combinational logic circuits in the integrated circuit 1 are completed, the test circuit 50 is operated in the shift phase and in the capture phase alternatively.

After the combinational logic circuits in the integrated circuit 1 are all tested, the test circuit 50 is operated in a memory build-in self-test mode to test the memory 10. When the test circuit 50 is operated in the memory build-in self-test mode, the scan test mode signal Ms is at the second voltage level, and the build-in self-test mode signal Mb is at the first voltage level. As shown in FIG. 3, the processing circuit 220 controls the test pattern generator 230 to generate a memory test pattern TP. The multiplexer MUX receives and outputs the memory test pattern TP according to the build-in self-test mode signal Mb with the first voltage level, so as to output a memory output value MOV. The modified flip flop MFF reads the input value of the third input pin D2 (i.e., output value of the memory 10) according to the scan test mode signal Ms with the second voltage level, so as to output the memory output value MOV to the memory build-in self-test circuit 20.

As shown in FIG. 3 again, the compare logic circuit 210 receives the memory output value MOV and compares the memory output value MOV with a predicted value (not shown), so as to generate a comparison result. The processing circuit 220 controls the test pattern generator 230 to generate another test pattern TP or directly output an error signal Err according to the comparison result. Specifically, when the comparison result indicates that the memory output value MOV equals the predicted value, the processing circuit 220 controls the test pattern generator 230 to generate another test pattern TP, so as to further test the memory 10. When the comparison result indicates that the memory output value MOV is not equal to the predicted value, the processing circuit 220 directly outputs the error signal Err to a register (not shown) inside the chip. The automatic test equipment ATE can read the data in the register inside the chip through the I/O bus (not shown) to know that the test result is in error, so as to determine that the abnormal condition occurs in memory 10.

Figure 4:
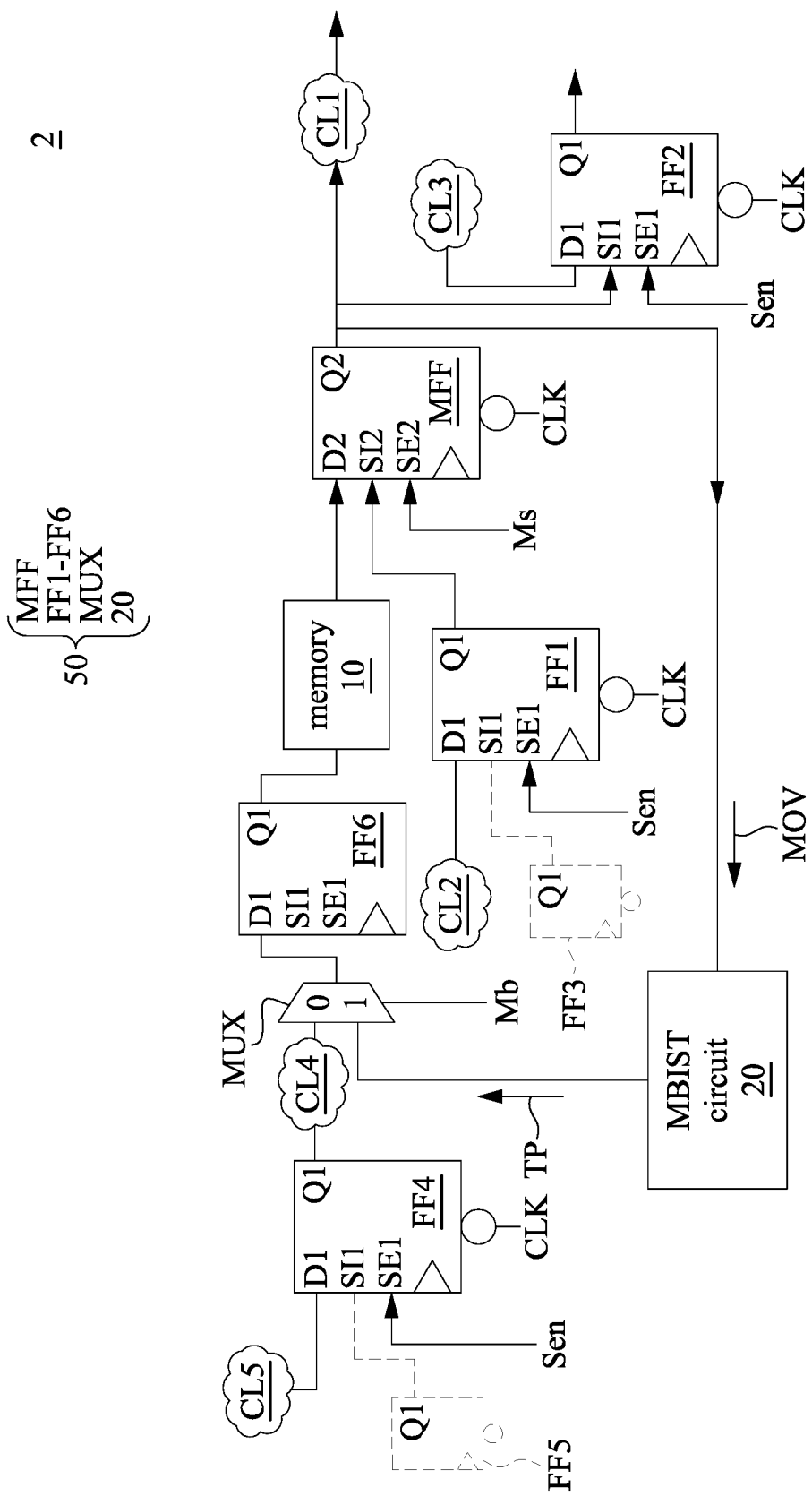
FIG. 4 is a schematic diagram of the integrated circuit including the test circuit in accordance with other embodiments of the present disclosure.

Referring to FIG. 4, FIG. 4 illustrates a schematic diagram of another integrated circuit 2. The integrated circuit 2 is similar to the integrated circuit 1 in structure and can also be tested by the automatic test equipment ATE external to the chip. The difference from the integrated circuit 1 is that the test circuit 50 on the integrated circuit 2 does not include the feedback circuit FB but further includes the normal flip flop FF6. For solving the problem that the combinational logic circuit coupled to the input terminal of the memory 10 cannot be tested, the normal flip flop FF6 is coupled between the output terminal of the multiplexer MUX and the input terminal of the memory 10. In structure, the first enable pin SE1 of the normal flip flop FF6 is coupled to the scan enable signal Sen. The first input pin D1 of the normal flip flop FF6 is coupled to the output terminal of the multiplexer MUX. The second input pin SI1 of the normal flip flop FF6 is coupled to the first output pin Q1 of another normal flip flop (not shown). In such way, the output value of the combinational logic circuit coupled to the input terminal of the memory 10 can be temporarily stored in the normal flip flop FF6 (through the first input pin D1) in the capture phase, be propagated to the following flip flops connected in series sequentially in the shift phase and be propagated to the scan output terminal SO finally, so that the automatic test equipment ATE receives the output value of the combinational logic circuit coupled to the input terminal of the memory 10. The automatic test equipment ATE can determine whether the combinational logic circuit CL4 and the multiplexer MUX is normally operated according to this output value. The other structures and operations of the embodiment as shown in FIG. 4 are same or similar to those of the above-described embodiments, and therefore the descriptions thereof are omitted herein.

In another embodiment, the memory build-in self-test circuit 20 is not required to exist, and the multiplexer MUX coupled to the input terminal of the memory 10 is not required to exist or can be regarded as a part of the combinational logic circuit CL4. The operations of the modified flip flop MFF and the feedback circuit FB in FIG. 2 as well as the operation of the normal flip flop FF6 in FIG. 4 are not affected by the above two transformed applications. The person skilled in the art can understand the detail of implement of the related technology, and therefore the descriptions thereof are omitted herein.

In another embodiment, the memory 10 of the above-described embodiments can be any circuit (i.e., black box circuit) to which the scan chain test cannot be applied. For example, the memory 10 can be the analog circuit or the digital circuit which cannot be connected to form the scan chain.

Figure 5:
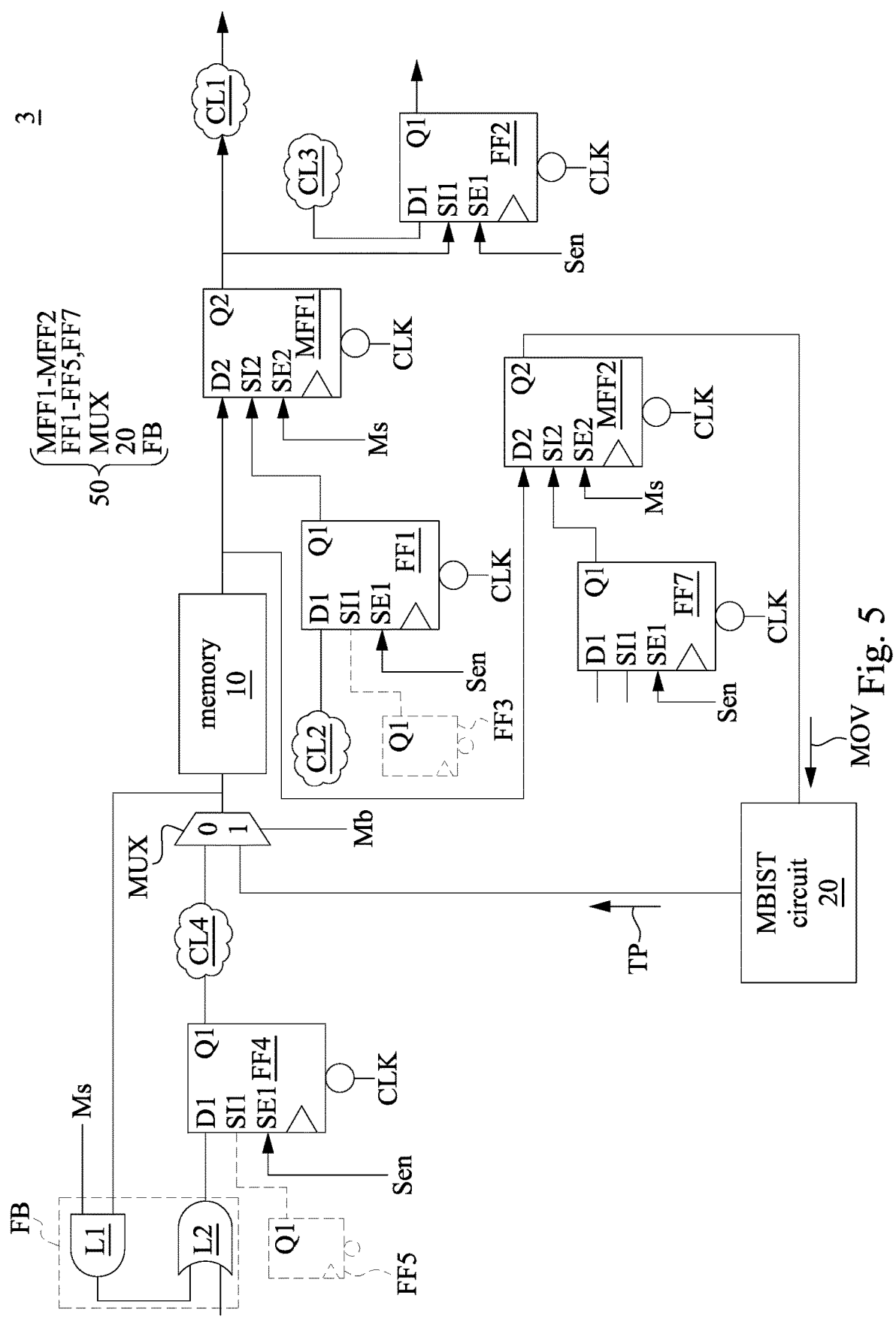
FIG. 5 is a schematic diagram of the integrated circuit including the test circuit in accordance with other embodiments of the present disclosure.

Referring to FIG. 5, FIG. 5 illustrates a schematic diagram of another integrated circuit 3. The integrated circuit 3 is similar to the integrated circuit 1 in structure and can also be tested by the automatic test equipment ATE external to the chip. The difference from the integrated circuit 1 is that the test circuit 50 on the integrated circuit 3 further includes another modified flip flop MFF2 besides the modified flip flop MFF1 (equivalent to the modified flip flop MFF). In structure, the third input pin D2 of the modified flip flop MFF2 is coupled to the output terminal of the memory 10. The fourth input pin SI2 of the modified flip flop MFF2 is coupled to the first output pin Q1 of the normal flip flop FF7. The second enable pin SE2 of the modified flip flop MFF2 is configured to receive the scan test mode signal Ms. In addition, the memory build-in self-test circuit 20 is coupled to the second output pin Q2 of the modified flip flop MFF2 but is not coupled to the second output pin Q2 of the modified flip flop MFF1. The other structures and operations of the embodiment as shown in FIG. 5 are same or similar to those of the above-described embodiments, and therefore the descriptions thereof are omitted herein.

In sum, the test circuit 50 of the present disclosure is able to omit the conventional by-pass circuit and the multiplexer coupled to the output terminal of the memory by coupling the modified flip flop MFF receiving the scan test mode signal Ms to the output terminal of the memory 10. In such way, the circuit areas of the integrated circuits 1-3 can be decreased, the problem of routing congestion is difficult to occur, and the delay to the output signal of the memory 10 is reduced (to avoid the problem of timing violation). Furthermore, since the test circuit 50 can complete the scan test in the condition that the components are decreased in number, the test yield of the integrated circuit can be increased, and the cost for scan test is reduced.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A test circuit for testing an integrated circuit, wherein the integrated circuit comprises a black box circuit and a plurality of combinational logic circuits, and the test circuit comprises:
 a plurality of normal flip flops, wherein the normal flip flops each comprises a first clock pin, a first input pin, a second input pin and a first output pin and is configured to temporarily store an input value of the first input pin or an input value of the second input pin according to a scan enable signal; and
 a modified flip flop comprising a second clock pin, a third input pin, a fourth input pin and a second output pin and configured to temporarily store an input value of the third input pin or an input value of the fourth input pin according to a scan test mode signal, wherein the third input pin is coupled to the black box circuit, the fourth input pin is coupled to one of the normal flip flops, and the second output pin is coupled to another one of the normal flip flops and one of the combinational logic circuits.

2. The test circuit of claim 1, wherein the third input pin is coupled to the output terminal of the black box circuit, the fourth input pin is coupled to the first output pin of a first normal flip flop of the normal flip flops, and the second output pin is coupled to a first combinational logic circuit of the combinational logic circuits and the second input pin of a second normal flip flop of the normal flip flops.

3. The test circuit of claim 2, wherein when the test circuit is operated in a shift phase of a scan test mode, the scan enable signal is at a first voltage level, the scan test mode signal is at the first voltage level;
 in response to a reception by the first clock pin and the second clock pin of a clock pulse, the first normal flip flop captures the output value of a third normal flip flop of the normal flip flops according to the scan enable signal with the first voltage level, the modified flip flop captures the output value of the first normal flip flop according to the scan test mode signal with the first voltage level, and the second normal flip flop captures the output value of the modified flip flop according to the scan enable signal with the first voltage level.

4. The test circuit of claim 3, wherein when the test circuit is operated in a capture phase of the scan test mode, the scan enable signal is at a second voltage level different to the first voltage level, the scan test mode signal is at the first voltage level;
 in response to a reception by the first clock pin and the second clock pin of a clock pulse, the first normal flip flop captures the output value of a second combinational logic circuit of the combinational logic circuits according to the scan enable signal with the second voltage level, the modified flip flop captures the output value of the first normal flip flop according to the scan test mode signal with the first voltage level, and the second normal flip flop captures the output value of a third combinational logic circuit of the combinational logic circuits according to the scan enable signal with the second voltage level.

5. The test circuit of claim 2, wherein a fourth combinational logic circuit of the combinational logic circuits is coupled between the input terminal of the black box circuit and a fourth normal flip flop of the normal flip flops;
 wherein the fourth combinational logic circuit comprises a multiplexer.

6. The test circuit of claim 5, further comprising a feedback circuit, wherein the feedback circuit is coupled to the output terminal of the fourth combinational logic circuit, the first input pin of the fourth normal flip flop and a logic circuit;
 when the test circuit is operated in a scan test mode, the feedback circuit calculates a feedback value according to the output value of the fourth combinational logic circuit and the output value of the logic circuit and propagates the feedback value to the first input pin of the fourth normal flip flop;
 when the test circuit is not operated in the scan test mode, the feedback circuit propagates the output value of the logic circuit to the first input pin of the fourth normal flip flop.

7. The test circuit of claim 5, wherein the first output pin of the fourth normal flip flop of the normal flip flops is coupled to the fourth combinational logic circuit, and a fifth normal flip flop of the normal flip flops is coupled between the output terminal of the fourth combinational logic circuit and the input terminal of the black box circuit.

8. The test circuit of claim 7, wherein when the test circuit is operated in a capture phase of a scan test mode, the scan enable signal is at a second voltage level, and the fifth normal flip flop captures the output value of the fourth combinational logic circuit according to the scan enable signal with the second voltage level in response to a reception by the first clock pin of a clock pulse.

9. The test circuit of claim 8, wherein when the test circuit is operated in a shift phase of the scan test mode, the scan enable signal is at a first voltage level different to the second voltage level, a sixth normal flip flop of the normal flip flops is coupled to the second input pin of the fifth normal flip flop, and the fifth normal flip flop captures the output value of the sixth normal flip flop according to the scan enable signal with the first voltage level in response to a reception by the first clock pin of a clock pulse.

10. The test circuit of claim 6, wherein the feedback circuit comprises a first logic gate and a second logic gate, the first input terminal of the first logic gate receives the scan test mode signal, the second input terminal of the first logic gate is coupled between the output terminal of the fourth combinational logic circuit and the input terminal of the black box circuit, the first input terminal of the second logic gate is coupled to the output terminal of the first logic gate, the second input terminal of the second logic gate is coupled to the logic circuit, and the output terminal of the second logic gate is coupled to the first input pin of the fourth normal flip flop.

11. The test circuit of claim 6, wherein the logic circuit is a fifth combinational logic circuit of the combinational logic circuits or a fifth normal flip flop of the normal flip flops.

12. The test circuit of claim 10, wherein the first logic gate is a AND gate, and the second logic gate is a OR gate.

13. The test circuit of claim 10, wherein the black box circuit is a memory.

14. The test circuit of claim 2, wherein the black box circuit is a memory;
 wherein the test circuit further comprises a memory build-in self-test circuit configured to output a test pattern for testing the memory and coupled to the modified flip flop.

15. The test circuit of claim 14, further comprising another modified flip flop, wherein the another modified flip flop comprises a fifth input pin, a sixth input pin and a third output pin and is configured to capture an input value of the fifth input pin or an input value of the sixth input pin according to the scan test mode signal.

16. The test circuit of claim 15, wherein the fifth input pin is coupled between the output terminal of the memory and the third input pin of the modified flip flop, the sixth input pin is coupled to the first output pin of a seventh normal flip flop of the normal flip flops, and the third output pin is coupled to the memory build-in self-test circuit.

17. The test circuit of claim 16, further comprising a multiplexer, wherein the first input terminal of the multiplexer is coupled to the memory build-in self-test circuit for receiving the test pattern, and the second input terminal of the multiplexer is coupled to a fourth combinational logic circuit of the combinational logic circuits;

wherein the fourth combinational logic circuit is coupled between the input terminal of the memory and a fourth normal flip flop of the normal flip flops.

* * * * *